United States Patent
Goto (10) Patent No.: US 9,577,627 B2
(45) Date of Patent: Feb. 21, 2017

(54) SEMICONDUCTOR DEVICE

(71) Applicant: MITSUBISHI ELECTRIC CORPORATION, Tokyo (JP)

(72) Inventor: Akiko Goto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/844,861

(22) Filed: Sep. 3, 2015

(65) Prior Publication Data

US 2016/0182032 A1     Jun. 23, 2016

(30) Foreign Application Priority Data

Dec. 18, 2014    (JP) ................................ 2014-256614

(51) Int. Cl.
| | |
|---|---|
| H03K 17/687 | (2006.01) |
| H03K 17/10 | (2006.01) |
| H03K 17/74 | (2006.01) |
| H03M 5/00 | (2006.01) |
| H03M 7/00 | (2006.01) |
| H01L 29/00 | (2006.01) |

(Continued)

(52) U.S. Cl.
CPC ............ *H03K 17/107* (2013.01); *H01L 29/00* (2013.01); *H02M 7/487* (2013.01); *H03K 17/6874* (2013.01); *H03K 17/74* (2013.01); *H03M 5/00* (2013.01); *H03M 7/00* (2013.01); *H02M 2001/0009* (2013.01)

(58) Field of Classification Search
None
See application file for complete search history.

(56) References Cited

U.S. PATENT DOCUMENTS

2009/0058500 A1* 3/2009 Osawa ............ H01L 23/49562
                                                                                 327/434
2010/0039843 A1* 2/2010 Takizawa ............ H02M 7/487
                                                                                363/131

(Continued)

FOREIGN PATENT DOCUMENTS

| JP | 2011-234544 A | 11/2011 |
|---|---|---|
| JP | 5556703 B2 | 7/2014 |

(Continued)

*Primary Examiner* — Long Nguyen
(74) *Attorney, Agent, or Firm* — Studebaker & Brackett PC (57) ABSTRACT

First and second external terminals are connected to high-voltage and low-voltage terminals, respectively, of a direct-current voltage source circuit in which first and second direct-current voltage sources are connected in series. A third external terminal is connected to a connecting point between the first and second direct-current voltage sources. A first switching element is connected between the first and fourth external terminals. A second switching element is connected between the fourth and second external terminals. A first AC switch unit includes third and fourth switching elements connected in inverse series between the third and fourth external terminals. A second AC switch unit includes fifth and sixth switching elements connected in inverse series between the third and fourth external terminals. The first and second AC switch units are connected in parallel. The first and second switching elements and the first and second AC switch units are incorporated in one module.

8 Claims, 7 Drawing Sheets

(51) Int. Cl.
*H02M 7/487* (2007.01)
*H02M 1/00* (2006.01)

(56) References Cited

U.S. PATENT DOCUMENTS

| 2012/0092915 | A1 | | 4/2012 | Okuda et al. | |
|---|---|---|---|---|---|
| 2014/0098587 | A1 | * | 4/2014 | Yatsu | H02M 7/537 363/131 |
| 2016/0028224 | A1 | * | 1/2016 | Yamada | H02M 7/487 363/56.11 |

FOREIGN PATENT DOCUMENTS

| JP | 2014-147200 A | 8/2014 |
|---|---|---|
| WO | 2010/146637 A1 | 12/2010 |

\* cited by examiner

SEMICONDUCTOR DEVICE

BACKGROUND OF THE INVENTION

Field of the Invention

The present invention relates to a semiconductor device forming a three-level power converter in which a turnoff surge voltage is reduced by reducing an inductance component.

Background Art

A three-level power converter has been adopted as a power converter for converting direct-current power into alternating-current power or for converting alternating-current power into direct-current power. A three-level power converter can reduce waveform distortion in an alternating-current voltage and enables producing an acoustic noise/electrical noise reduction effect.

Figure 20:
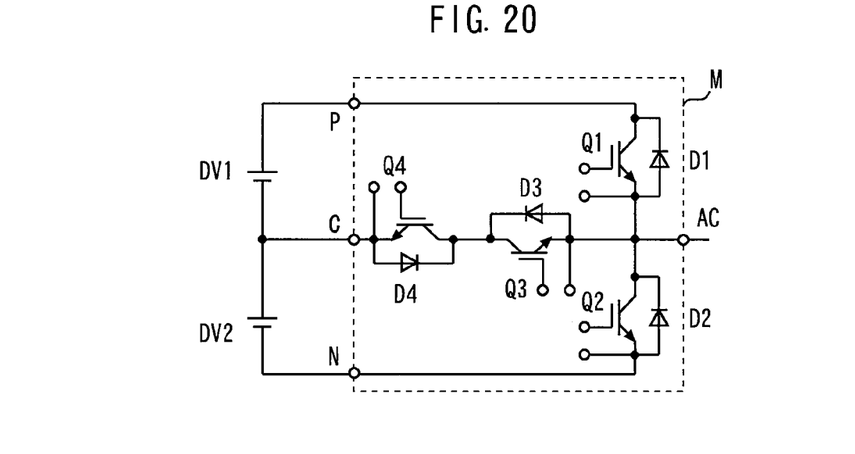
FIGS. 20 and 21 are circuit diagrams each showing a conventional three-level power converter.
Figure 21:
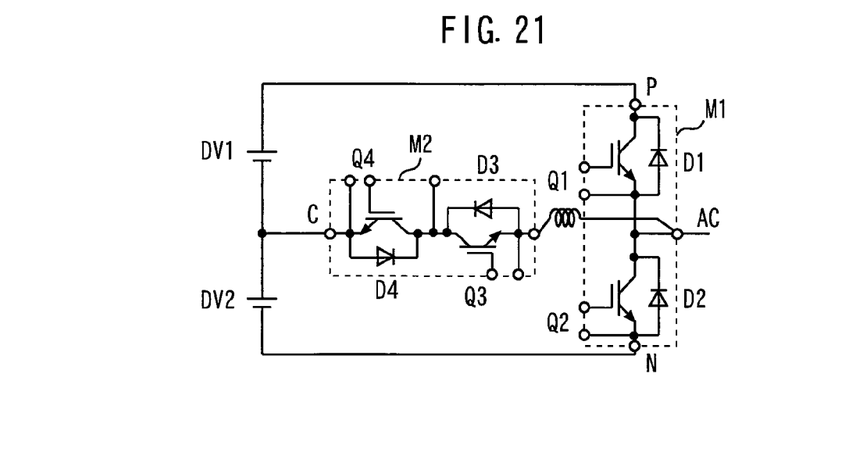

FIGS. 20 and 21 are circuit diagrams each showing a conventional three-level power converter. FIG. 20 shows a 4-in-1 module, while FIG. 21 shows a 2-in-1 module and a collector-common module.

External terminals P and N are connected to a high-voltage terminal and a low-voltage terminal, respectively, of a direct-current voltage source circuit in which direct-current voltage sources DV1 and DV2 are connected in series. An external terminal C is connected to a connecting point between the direct-current voltage source DV1 and the direct-current voltage source DV2. A switching element Q1 is connected between the external terminal P and an external terminal AC. A switching element Q2 is connected between the external terminal AC and the external terminal N. Switching elements Q3 and Q4 are connected in inverse series connection with each other as an AC switch unit between the external terminal C and the external terminal AC.

The device shown in FIG. 20 is formed by incorporating the switching elements Q1 to Q4 in one module M and connecting the module to the direct-current voltage source circuit. The device shown in FIG. 21 is formed by incorporating in a first module M1 the switching elements Q1 and Q2 forming a bridge unit, incorporating in a second module M2 the switching elements Q3 and Q4 forming the AC switch unit and connecting the first and second modules to the direct-current voltage source circuit (see, for example, International Publication No. WO 2010/146637).

SUMMARY OF THE INVENTION

When one of the switching elements Q1 to Q4 is turned on while the others are turned off, a voltage is output from the external terminal AC. At this time, a high frequency current is caused by switching to flow through a commutation loop extending from the direct-current voltage source and returning to the direct-current voltage source via the switching element, thereby generating a high di/dt. -L.di/dt generated by the inductance component of this commutation loop is applied as a turnoff surge voltage to an IGBT in the switching element.

Turnoff surge voltages corresponding to the respective inductances of the commutation loop including the direct-current voltage source DV1 and the switching elements Q1, Q3, and Q4 and the commutation loop including the direct-current voltage source DV2 and the switching elements Q2, Q3, and Q4 are generated. In the case of the device shown in FIG. 20, it is difficult to simultaneously reduce both the inductances of the two commutation loops and, therefore, either of the turnoff surge voltages can be high. In the case of the device shown in FIG. 21, the turnoff surge voltages are increased by the inductance component of a portion connecting the first module M1 and the second module M2.

If the turnoff surge voltage on the IGBT exceeds the withstand voltage, the IGBT is broken. There is a need to provide a bypass for the high frequency current by connecting a film capacitor or a snubber circuit in the vicinity of the semiconductor device in order to avoid breakage of the IGBT. The added capacitor or snubber circuit, however, causes a loss at the time of switching. Use of a switching element of a high withstand voltage in place of the snubber circuit is possible but it entails not only an increase in price of the semiconductor device but also an increase in conduction loss.

Also, di/dt may be reduced by reducing the switching speed of the IGBT in order to limit the turnoff surge voltage. In such a case, however, an increase in loss in the switching element occurs. With a power converter for use, for example, in a solar power conditioner or an uninterruptible power supply (UPS), in which importance is attached to the conversion efficiency, there is a problem that the conversion efficiency is reduced with an increase in loss in the semiconductor device and the power converter due to turnoff surge voltages.

In view of the above-described problems, an object of the present invention is to provide a semiconductor device capable of reducing turnoff surge voltages and losses.

According to the present invention, a semiconductor device includes: first and second external terminals connected to a high-voltage terminal and a low-voltage terminal, respectively, of a direct-current voltage source circuit in which first and second direct-current voltage sources are connected in series; a third external terminal connected to a connecting point between the first and second direct-current voltage sources; a fourth external terminal; a first switching element connected between the first external terminal and the fourth external terminal; a second switching element connected between the fourth external terminal and the second external terminal; a first AC switch unit including third and fourth switching elements connected in inverse series connection with each other between the third external terminal and the fourth external terminal; and a second AC switch unit including fifth and sixth switching elements connected in inverse series connection with each other between the third external terminal and the fourth external terminal, wherein the first and second AC switch units are connected in parallel with each other, and the first and second switching elements and the first and second AC switch units are incorporated in one module.

Since the first and second AC switch units are connected in parallel with each other in the present invention, the inductance component of the first commutation loop and the inductance component of the second commutation loop can be simultaneously reduced. Also, since the first and second switching elements in the bridge unit and the first and second AC switch units are incorporated in one module, the inductance of each commutation loop is small, thus enabling reducing the turnoff surge voltages. There is no need for a snubber circuit for bypassing or a switching element of a high withstand voltage, and there is also no need to reduce the switching speed, thus enabling reducing losses.

Other and further objects, features and advantages of the invention will appear more fully from the following description.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

First Embodiment

Figure 1:
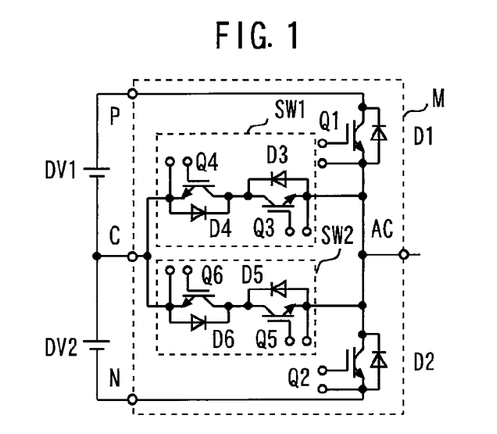
FIG. 1 is a circuit diagram showing a semiconductor device according to a first embodiment of the present invention.

FIG. 1 is a circuit diagram showing a semiconductor device according to a first embodiment of the present invention. External terminals P and N are connected to a high-voltage terminal and a low-voltage terminal, respectively, of a direct-current voltage source circuit in which direct-current voltage sources DV1 and DV2 are connected in series. An external terminal C is connected to a connecting point between the direct-current voltage source DV1 and the direct-current voltage source DV2. A switching element Q1 is connected between the external terminal P and an external terminal AC. A switching element Q2 is connected between the external terminal AC and the external terminal N.

Switching elements Q3 and Q4 are connected in inverse series connection with each other as an AC switch unit SW1 between the external terminal C and the external terminal AC. Switching elements Q5 and Q6 are connected in inverse series connection with each other as an AC switch unit SW2 between the external terminal C and the external terminal AC. The AC switch units SW1 and SW2 are connected in parallel with each other.

Each of the switching elements Q1 to Q6 is, for example, an insulated gate bipolar transistor (IGBT). Diodes D1 to D6 are connected in inverse parallel connection with the switching elements Q1 to Q6, respectively.

The switching elements Q1 to Q6 and the diodes D1 to D6 are incorporated in one module M. The AC switch units SW1 and SW2 are connected in parallel with each other in the module M.

When E [V] is applied between the terminals P and N, E/2 [V] is applied between the terminals P and C and applied between the terminals C and N. When the switching element Q1 in the switching elements Q1 to Q6 is turned on while the other switching elements are turned off, a voltage of E [V] is output from the external terminal AC. When one of the switching elements Q3 to Q6 in the switching elements Q1 to Q6 is turned on while the other switching elements are turned off, when the switching elements Q3 and Q5 are turned on while the other switching elements are turned off, or when the switching elements Q4 and Q6 are turned on while the other switching elements are turned off, a voltage of E/2 [V] is output from the external terminal AC. When the switching element Q2 in the switching elements Q1 to Q6 is turned on while the other switching elements are turned off, a voltage of 0 [V] is output from the external terminal AC. This power converter can thus generate alternating-current voltages consisting of three potentials at three levels 0, E/2, and E.

Turnoff surge voltages on the switching elements Q1, Q3, and Q4 are generated according to an inductance component of a first commutation loop extending from the direct-current voltage source DV1 to one after another of the external terminal P, the switching element Q1, the AC switch unit SW1 in which the switching elements Q3 and Q4 are connected in inverse series connection with each other and the external terminal C and returning to the direct-current voltage source DV1. Turnoff surge voltages on the switching elements Q2, Q5, and Q6 are generated according to an inductance component of a second commutation loop extending from the direct-current voltage source DV2 to one after another of the external terminal C, the AC switch unit SW2 in which the switching elements Q5 and Q6 are connected in inverse series connection with each other, the switching element Q2 and the external terminal N and returning to the direct-current voltage source DV2.

Since the AC switch units SW1 and SW2 are connected in parallel with each other in the present embodiment, the inductance component of the first commutation loop and the inductance component of the second commutation loop can be simultaneously reduced. Also, since the switching elements Q1 and Q2 in the bridge unit and the AC switch units SW1 and SW2 are incorporated in one module M, the inductance of each commutation loop is small, thus enabling reducing the turnoff surge voltages. There is no need for a snubber circuit for bypassing or a switching element of a high withstand voltage, and there is also no need to reduce the switching speed, thus enabling reducing losses. Also, the increase in temperature of the AC switch unit can be limited by dividing the loss in the AC switch unit into two.

The direct-current voltage sources and the module M can be disposed closed to each other by placing the external terminal P and the external terminal C of the module M adjacent to the direct-current voltage sources. It is, therefore, easy to effectively mount parallel plates or snubber circuits and to reduce the inductance component of the connecting portion. The same can also be said with respect to the external terminals C and N.

To reduce the inductance, the external terminal P and the external terminal C are disposed as close as possible to each other and the external terminal N and the external terminal C are disposed as close as possible to each other provided that a certain insulation distance can be secured. The distance between the external terminal P and the external terminal AC is set at least 1.5 times the distance between the external terminal P and the external terminal C, and the distance between the external terminal N and the external terminal AC is set at least 1.5 times the distance between the external terminal N and the external terminal C. For example, the external terminals P, C, and N are disposed in this order on one side of a three-level T-type 4-in-1 module, and the external terminal AC is disposed on the side opposite from the side on which external terminals P, C, and N are disposed.

Second Embodiment

Figure 2:
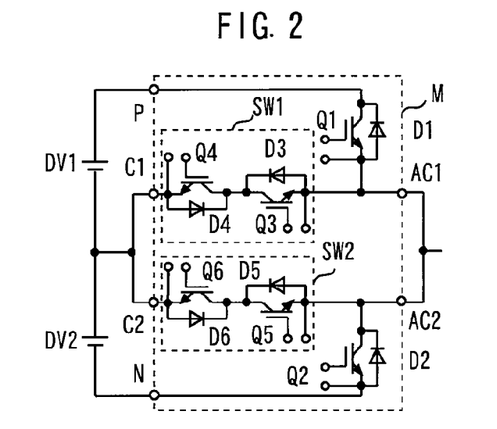
FIG. 2 is a circuit diagram showing a semiconductor device according to a second embodiment of the present invention.

FIG. 2 is a circuit diagram showing a semiconductor device according to a second embodiment of the present invention. An external terminal C1 connected to the first AC switch unit and an external terminal C2 connected to the second AC switch unit are provided in place of the external terminal C in the first embodiment. An external terminal AC1 connected to the switching element Q1 and to the first AC switch unit and an external terminal AC2 connected to the switching element Q2 and to the second AC switch unit are provided in place of the external terminal AC in the first embodiment. The external terminals C1 and C2 are electrically connected to each other not in the module M but outside the module M. The external terminals AC1 and AC2 are electrically connected to each other not in the module M but outside the module M.

The external terminal P and the external terminal C1 are placed close to each other, the external terminal N and the external terminal C2 are placed close to each other, and the external terminal C1 and the external terminal C2 are placed close to each other. The distance between the external terminal P and the external terminal AC1 is set at least 1.5 times the distance between the external terminal P and the external terminal C1. The distance between the external terminal N and the external terminal AC2 is set at least 1.5 times the distance between the external terminal N and the external terminal C2.

In the present embodiment, the connections between the first and second switch units in parallel connection are made outside the module M. The internal wiring in the module M can thereby be simplified in comparison with that in the first embodiment in which the connections between the first and second AC switch units in parallel connection are made in the module M, thereby further reducing the inductance components in the module M. Thus, the occurrence of surge voltages at the time of switching can be further reduced and the reduction in conversion efficiency of the power converter with the increase in loss due to the turnoff surge voltages can be reduced.

While in the present embodiment the external terminals C1 and C2 are externally connected and the external terminals AC1 and AC2 are externally connected, either the external terminals C1 and C2 or the external terminals AC1 and AC2 may be externally connected.

Third Embodiment

Figure 3:
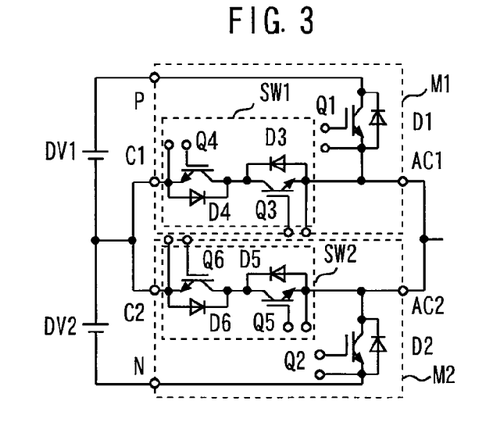
FIG. 3 is a circuit diagram showing a semiconductor device according to a third embodiment of the present invention.

FIG. 3 is a circuit diagram showing a semiconductor device according to a third embodiment of the present invention. In the present embodiment, the switching element Q1 and the AC switch unit SW1 are incorporated in the module M1, while the switching element Q2 and the AC switch unit SW2 are incorporated in the module M2. The connections between the first and second AC switch units in parallel connection are made outside the modules M1 and M2, thus forming a semiconductor device having the same circuit connections as those in the second embodiment.

The module M1 has external terminals P, C1, and AC1, and the module M2 has external terminals N, C2, and AC2. The external terminal P and the external terminal C1 are placed close to each other and the external terminal N and the external terminal C2 are placed close to each other. The distance between the external terminal P and the external terminal AC1 is set at least 1.5 times the distance between the external terminal P and the external terminal C1. The distance between the external terminal N and the external terminal AC2 is set at least 1.5 times the distance between the external terminal N and the external terminal C2.

In the present embodiment, the degree of freedom of layout in the entire power converter is increased by forming two separate modules in comparison with the first embodiment using only one module. In particular, in a case where a plurality of modules are connected in parallel with each other to secure a predetermined current capacity, the inductances of the commutation loops can be reduced by disposing the first and second direct-current voltage sources DV1 and DV2 close to the modules M1 and M2 and by forming going and returning lines closed to each other (by forming the lines of parallel plates or the like). Also, the provision of the divided modules enables increasing the heat sink area between the semiconductor device and a piece of heat dissipation and cooling equipment (e.g., a heat sink) and improving the heat dissipation effect.

Since the external terminal C1 of the module M1 and the external terminal C2 of the module M2 are connected to each other, and since the external terminal AC1 of the module M1 and the external terminal AC2 of the module AC2 are connected to each other, it is desirable to dispose the external terminals of the modules M1 and M2 so that they are line symmetric about one side.

Fourth Embodiment

Figure 4:
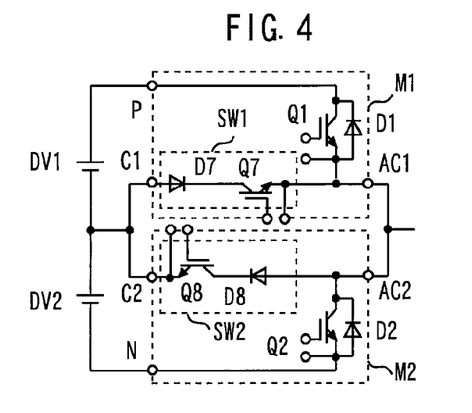
FIG. 4 is a circuit diagram showing a semiconductor device according to a fourth embodiment of the present invention.

FIG. 4 is a circuit diagram showing a semiconductor device according to a fourth embodiment of the present invention. This semiconductor device is suitable for use (for example, in an inverter or a solar power conditioner) in which if the direction in which the current flows from the direct-current voltage source circuit into the semiconductor device is positive, the average current is limited to a positive (power factor PF=0 to 1).

A switching element Q7 and a diode D7 are connected in inverse series connection with each other as AC switch unit SW1 between the external terminal C1 and the external terminal AC1. A switching element Q8 and a diode D8 are connected in inverse series connection with each other as AC switch unit SW2 between the external terminal C2 and the external terminal AC2. The AC switch units SW1 and SW2 are connected in parallel with each other. The AC switch units SW1 and SW2 are connected in inverse series connection with the switching elements Q1 and Q2, respectively. The switching element Q1 and the AC switch unit SW1 are incorporated in a module M1, while the switching element Q2 and the AC switch unit SW2 are incorporated in a module M2.

The connections between the AC switch units SW1 and SW2 in inverse parallel connection are made outside the modules M1 and M2. The same function as that in the third embodiment can therefore be expected in use in which the average current is limited to a positive. This is because if the average current is limited to a positive, the path for energization of the switching elements Q1 and Q2 and the AC switch units SW1 and SW2, i.e., the order in which the switching elements operate, can be uniquely determined. A combination of the switching elements exists such that the switching elements do not operate continuously, and the inductance components between those switching elements do not contribute to an increase in turnoff surge voltage. Therefore, the switching elements in the AC switch units SW1 and SW2 can be reduced. A reduction in size of the semiconductor device and, hence, a reduction in size of the entire power converter can thereby be achieved and the control of the switching elements can also be simplified.

Figure 5:
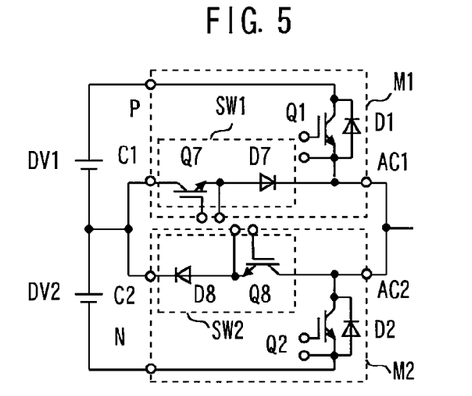
FIGS. 5 to 7 are circuit diagrams showing modified examples 1 to 3 of the semiconductor device according to the fourth embodiment of the present invention.
Figure 6:
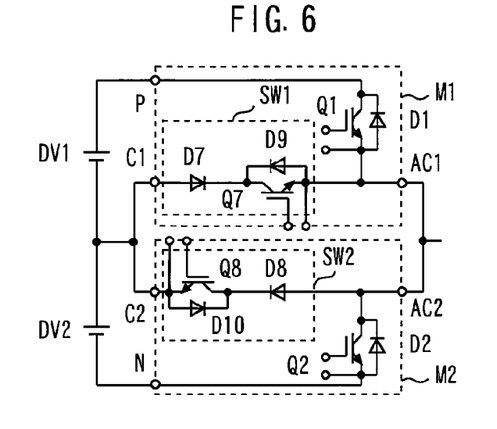
Figure 7:
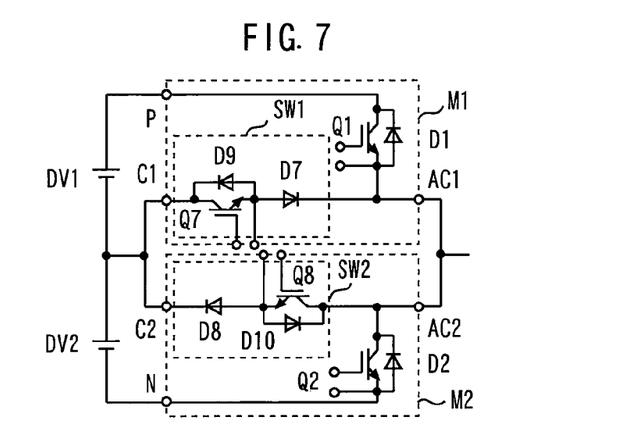

FIGS. 5 to 7 are circuit diagrams showing modified examples 1 to 3 of the semiconductor device according to the fourth embodiment of the present invention. In modified example 1, the orders of the switching elements and the diodes in the AC switch units SW1 and SW2 are reversed with respect to those in the example shown in FIG. 4. Thus, the switching elements and the diodes may be disposed in any order in the AC switch units SW1 and SW2.

In modified examples 2 and 3, diodes D9 and D10 are connected in inverse parallel connection with the switching elements Q7 and Q8. By the switching operations of the switching elements Q1 and Q2, reverse withstand voltages are applied to the switching elements Q7 and Q8. The diodes D9 and D10 protect the switching elements Q7 and Q8 from these reverse withstand voltages, thereby preventing element breakage.

It is not necessary to factor in conduction losses in the diodes D9 and D10. Therefore, the chip area of the diodes D9 and D10 equal to or smaller than half that of the switching elements Q7 and Q8 may suffice. Since each of the directions of currents flowing in the AC switch units SW1 and SW2 is limited to one direction, the diodes D9 and D10 may be removed.

The ratios of the areas of the diodes D1 and D2 to the areas of the switching elements Q1 and Q2 which are IGBTs are ordinarily about 0.5 to 0.85 respectively. On the other hand, these ratios are preferably 0.1 to 0.4 in the case of use (e.g., in a solar power conditioner) limited to an operation in which the average current is positive and the power factor is equal to or higher than a certain value (e.g., PF=0.8 to 1.0). The current capacity of the switching elements Q1 and Q2 is increased thereby. At PF=0.8 to 1.0, the steady loss in the switching elements Q1 and Q2 is dominant Therefore, the steady loss may be reduced by increasing the current capacity of the switching elements Q1 and Q2 in order to reduce the loss in the entire device. Also, at PF=0.8 to 1.0, the loss generated in the diodes D1 and D2 is markedly small in comparison with that in the switching elements Q1 and Q2. Therefore, the capacitive component may be reduced by selecting diodes D1 and D2 capable of allowing the least peak current in order to reduce the loss in the entire device including the switching losses in the switching elements Q1 and Q2.

Fifth Embodiment

Figure 8:
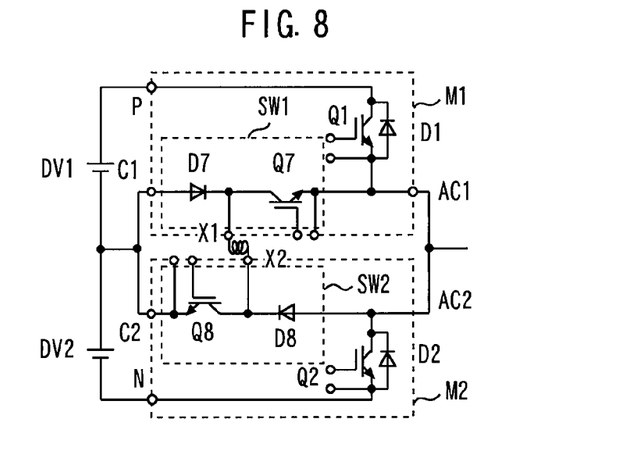
FIG. 8 is a circuit diagram showing a semiconductor device according to a fifth embodiment of the present invention.

FIG. 8 is a circuit diagram showing a semiconductor device according to a fifth embodiment of the present invention. An external terminal X1 connected to the connecting point between the switching element Q7 and the diode D7 is provided on the module M1. An external terminal X2 connected to the connecting point between the switching element Q8 and the diode D8 is provided on the module M2. The external terminals X1 and X2 are connected outside the modules M1 and M2 to connect the switching elements Q7 and Q8 in inverse series connection. In other respects, the arrangement is the same as that in the fourth embodiment.

The connection between the connecting point between the switching element Q7 and the diode D7 and the connecting point between the switching element Q8 and the diode D8 made as described above stabilizes the potential between the switching elements Q7 and Q8 and stabilizes the switching operation particularly in a case where a plurality of semiconductor devices are connected in parallel with each other.

In a case where a plurality of semiconductor devices are connected in parallel with each other to secure a predetermined current capacity, the voltage between the switching elements Q7 and Q8 in the modules M1 and M2 connected in parallel with each other can be made uniform to prevent current unbalance in the parallel connection.

The values of the current flowing through the AC switch units SW1 and SW2 can be detected from the potential difference between the external terminals X1 and X2. Therefore, characteristic checking and inspection on the elements in the AC switch units SW1 and SW2 can be performed.

Also, the provision of the external terminals X1 and X2 on the modules M1 and M2 having reliable insulating characteristics enables avoidance of generation of any metallic pattern floating electrically in the device (having no electrical connection to the outside) and, hence, prevention of insulation deterioration of the semiconductor device. In a case where emitter-common connections of switching elements Q7 and Q8 are made, the external terminals X1 and X2 can also be used for emitter sense for gate drive.

Figure 9:
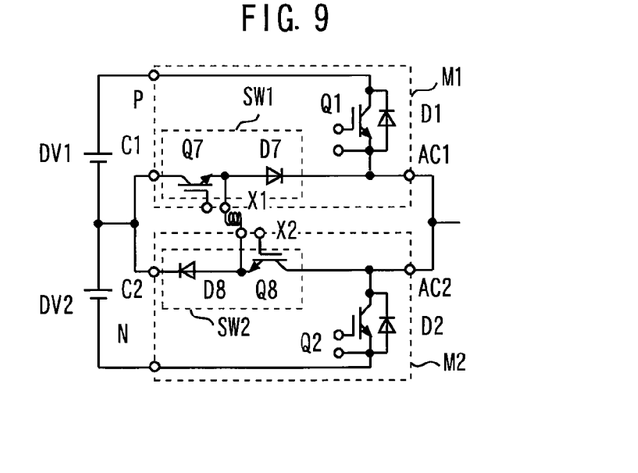
FIGS. 9 to 11 are circuit diagrams showing modified examples 1 to 3 of the semiconductor device according to the fifth embodiment of the present invention.
Figure 10:
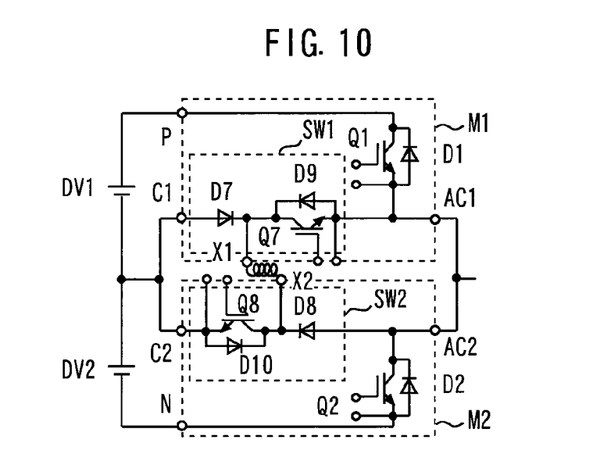
Figure 11:
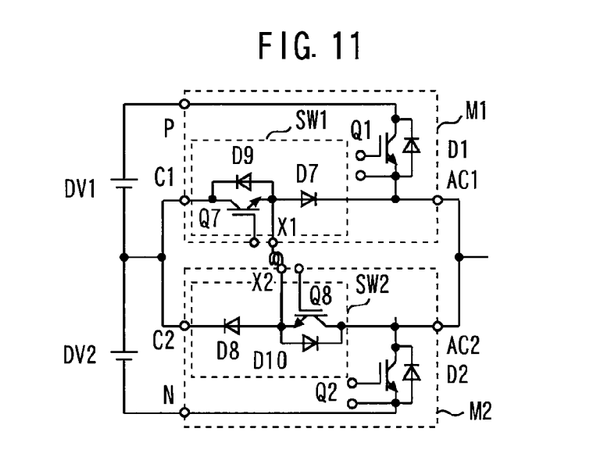

FIGS. 9 to 11 are circuit diagrams showing modified examples 1 to 3 of the semiconductor device according to the fifth embodiment of the present invention. In modified example 1, the orders of the switching elements and the diodes in the AC switch units SW1 and SW2 are reversed with respect to those in the example shown in FIG. 8. Thus, the switching elements and the diodes may be disposed in any order in the AC switch units SW1 and SW2.

In modified examples 2 and 3, diodes D9 and D10 are connected in inverse parallel connection with the switching elements Q7 and Q8. By the switching operations of the switching elements Q1 and Q2, reverse withstand voltages are applied to the switching elements Q7 and Q8. The diodes D9 and D10 protect the switching elements Q7 and Q8 from these reverse withstand voltages, thereby preventing element breakage.

The external terminals X1 and X2 are made smaller in surface area than the other external terminals such as P, N, C1, C2, AC1, and AC2. As a result, an inductance component is generated between the external terminals X1 and X2 electrically connected. This inductance component impedes currents flowing into the diodes D9 and D10 (conduction). Therefore, it is not necessary to factor in conduction losses in the diodes D9 and D10, and the chip area of the diodes D9 and D10 equal to or smaller than half that of the switching elements Q7 and Q8 may suffice. Since each of the directions of currents flowing in the AC switch units SW1 and SW2 is limited to one direction, the diodes D9 and D10 may be removed.

Sixth Embodiment

Figure 12:
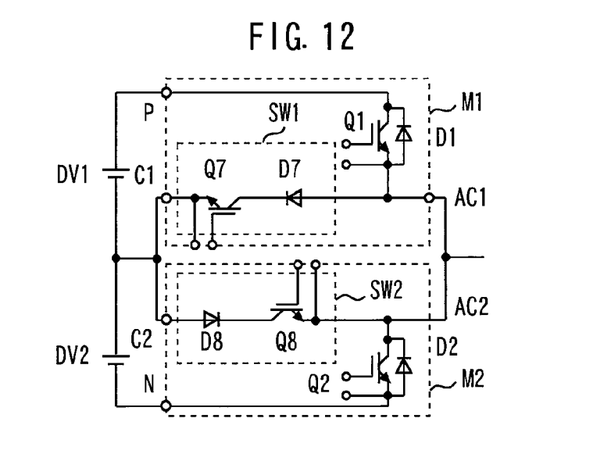
FIG. 12 is a circuit diagram showing a semiconductor device according to a sixth embodiment of the present invention.

FIG. 12 is a circuit diagram showing a semiconductor device according to a sixth embodiment of the present invention. This semiconductor device is suitable for use (for example, in a charger or a regeneration operation) in which if the direction in which the current flows from the direct-current voltage source circuit into the semiconductor device is positive, the average current is limited to a negative (power factor PF=0 to −1). The directions of the diodes D7 and D8 are opposite to those in the fourth embodiment, and the AC switch units SW1 and SW2 are connected in series connection with the switching elements Q1 and Q2.

The connections between the AC switch units SW1 and SW2 in inverse parallel connection are made outside the first and second modules. The same function as that in the third embodiment can therefore be expected in use in which the average current is limited to a negative. This is because if the average current is limited to a negative, the energization path, i.e., the order in which the switching elements operate, can be uniquely determined, as in the case where the average current is limited to a positive. A combination of the switching elements exists such that the switching elements do not operate continuously, and the inductance components between those switching elements do not contribute to an increase in turnoff surge voltage. Therefore, the switching elements in the AC switch units SW1 and SW2 can be reduced. A reduction in size of the semiconductor device and, hence, a reduction in size of the entire power converter can thereby be achieved and the control of the switching elements can also be simplified.

Figure 13:
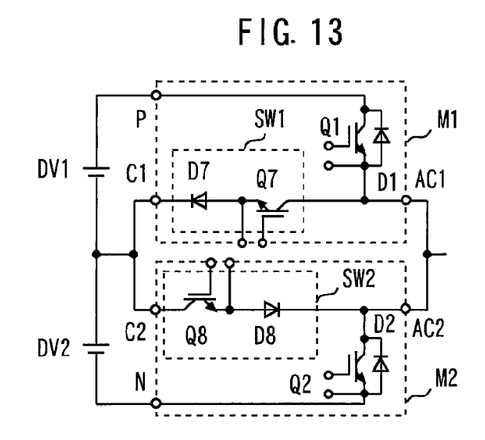
FIGS. 13 to 15 are circuit diagrams showing modified examples 1 to 3 of the semiconductor device according to the sixth embodiment of the present invention.
Figure 14:
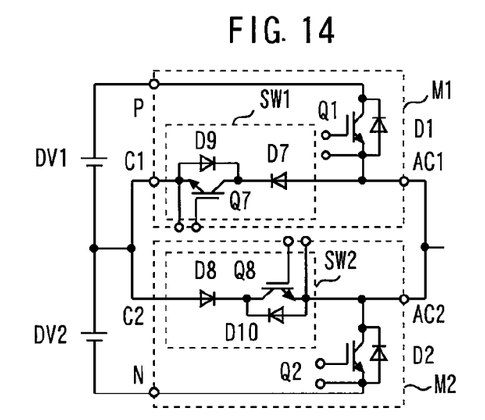
Figure 15:
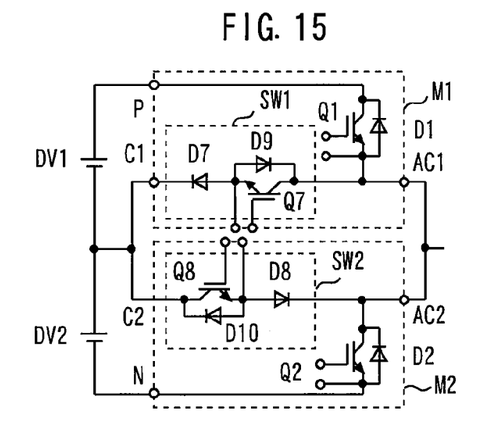

FIGS. 13 to 15 are circuit diagrams showing modified examples 1 to 3 of the semiconductor device according to the sixth embodiment of the present invention. In modified example 1, the orders of the switching elements and the diodes in the AC switch units SW1 and SW2 are reversed with respect to those in the example shown in FIG. 12. Thus, the switching elements and the diodes may be disposed in any order in the AC switch units SW1 and SW2.

In modified examples 2 and 3, diodes D9 and D10 are connected in inverse parallel connection with the switching elements Q7 and Q8. By the switching operations of the switching elements Q1 and Q2, reverse withstand voltages are applied to the switching elements Q7 and Q8. The diodes D9 and D10 protect the switching elements Q7 and Q8 from these reverse withstand voltages, thereby preventing element breakage.

It is not necessary to factor in conduction losses in the diodes D9 and D10. Therefore, the chip area of the diodes D9 and D10 equal to or smaller than half that of the switching elements Q7 and Q8 may suffice. Since each of the directions of currents flowing in the AC switch units SW1 and SW2 is limited to one direction, the diodes D9 and D10 may be removed.

The ratios of the areas of the diodes D1 and D2 to the areas of the switching elements Q1 and Q2 which are IGBTs are ordinarily about 0.5 to 0.85. On the other hand, these ratios are preferably equal to or higher than 0.85 respectively in the case of use (e.g., in a charger) limited to an operation in which the average current is negative and the power factor is equal to or higher than a certain value (e.g., PF=−0.8 to −1.0). The current capacity of the diodes D1 and D2 is increased thereby. At PF=−0.8 to −1.0, the steady loss in the diodes D1 and D2 is dominant. Therefore, the steady loss may be reduced by increasing the current capacity of the diodes D1 and D2 in order to reduce the loss in the entire device. Also, at PF=−0.8 to −1.0, the loss generated in the switching elements Q1 and Q2 is markedly small in comparison with that in the diodes D1 and D2. Therefore, the capacitive component may be reduced by selecting switching elements Q1 and Q2 capable of allowing the least peak current in order to reduce the loss in the entire device including the switching losses in the diodes D1 and D2.

Seventh Embodiment

Figure 16:
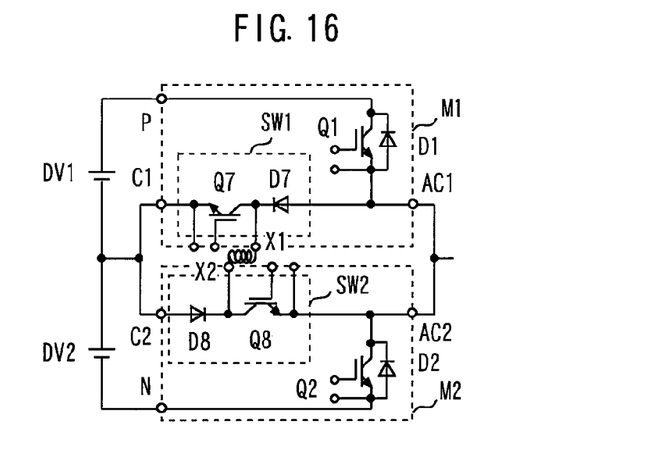
FIG. 16 is a circuit diagram showing a semiconductor device according to a seventh embodiment of the present invention.

FIG. 16 is a circuit diagram showing a semiconductor device according to a seventh embodiment of the present invention. An external terminal X1 connected to the connecting point between the switching element Q7 and the diode D7 is provided on the module M1. An external terminal X2 connected to the connecting point between the switching element Q8 and the diode D8 is provided on the module M2. The external terminals X1 and X2 are connected outside the modules M1 and M2 to connect the switching elements Q7 and Q8 in inverse series connection. In other respects, the arrangement is the same as that in the sixth embodiment. The same effects as those in the fifth embodiment can thereby obtained.

Figure 17:
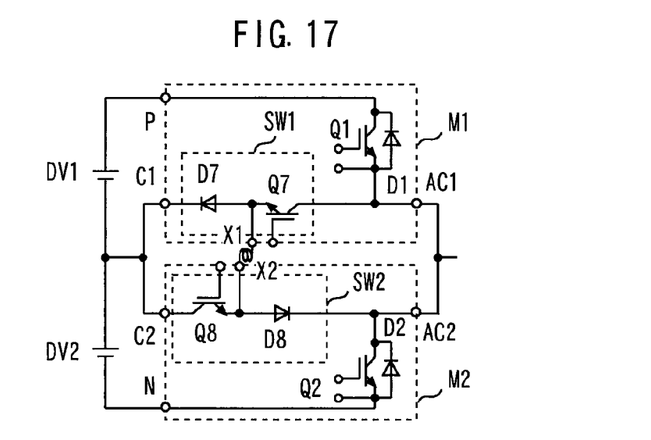
FIGS. 17 to 19 are circuit diagrams showing modified examples 1 to 3 of the semiconductor device according to the seventh embodiment of the present invention.
Figure 18:
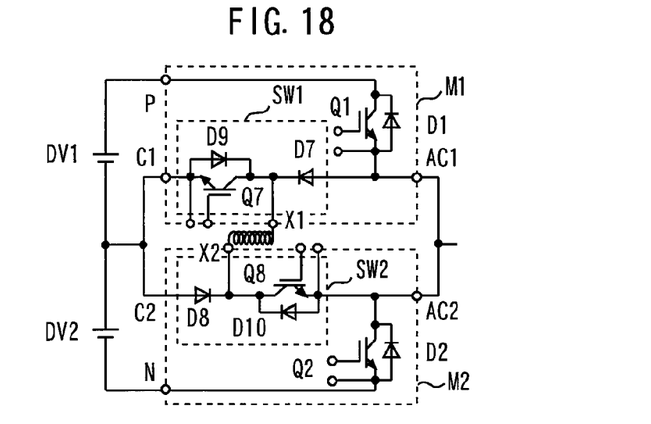
Figure 19:
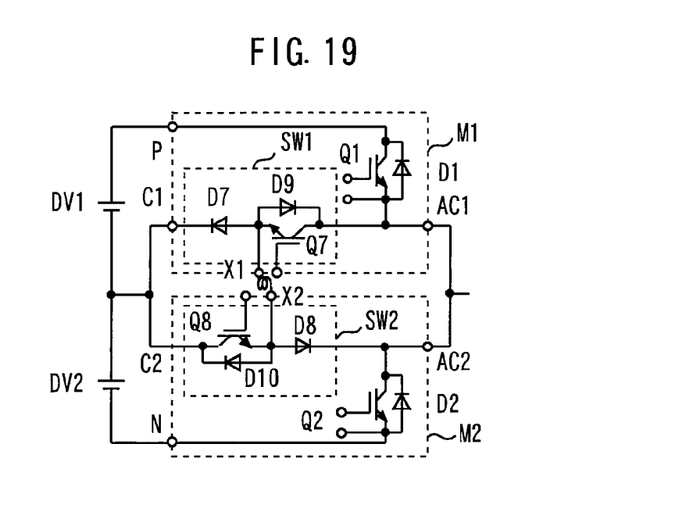

FIGS. 17 to 19 are circuit diagrams showing modified examples 1 to 3 of the semiconductor device according to the seventh embodiment of the present invention. In modified example 1, the orders of the switching elements and the diodes in the AC switch units SW1 and SW2 are reversed with respect to those in the example shown in FIG. 16. In modified examples 2 and 3, diodes D9 and D10 are connected in inverse parallel connection with the switching elements Q7 and Q8. The same effects as those in the modified examples 1 to 3 of the fifth embodiment can thereby obtained.

The present invention is not limited to the collector-common semiconductor devices described above as the first to seventh embodiments. The present invention can also be applied to an emitter-common semiconductor device to achieve the same effects.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-256614, filed on Dec. 18, 2014 including specification, claims, drawings and summary, on which the Convention priority of the present application is based, is incorporated herein by reference in its entirety.

What is claimed is:

1. A semiconductor device comprising:
   first and second external terminals connected to a high-voltage terminal and a low-voltage terminal, respectively, of a direct-current voltage source circuit in which first and second direct-current voltage sources are connected in series;
   third and fourth external terminals connected to a connecting point between the first and second direct-current voltage sources;
   fifth and sixth external terminals;
   a first switching element connected between the first external terminal and the fifth external terminal;
   a second switching element connected between the second external terminal and the sixth external terminal;
   a first AC switch unit including a third switching element and a first diode connected in series connection with each other between the third external terminal and the fifth external terminal; and
   a second AC switch unit including a fourth switching element and a second diode connected in series connection with each other between the fourth external terminal and the sixth external terminal, wherein the first and second AC switch units are connected in parallel with each other, the first switching element and the first AC switch unit are incorporated in a first module, and the second switching element and the second AC switch unit are incorporated in a second module.

2. The semiconductor device according to claim 1, wherein the first and second AC switch units are connected in inverse series connection with the first and second switching elements respectively.

3. The semiconductor device according to claim 1, further comprising third to sixth diodes connected in inverse parallel connection with the first to fourth switching elements respectively.

4. The semiconductor device according to claim 3, wherein ratios of the areas of the first and second diodes to areas of the first and second switching elements are 0.1 to 0.4 respectively.

5. The semiconductor device according to claim 1, wherein the first and second AC switch units are connected in series connection with the first and second switching elements respectively.

6. The semiconductor device according to claim 5, further comprising third to sixth diodes connected in inverse parallel connection with the first to fourth switching elements respectively.

7. The semiconductor device according to claim 6, wherein ratios of areas of the first and second diodes to areas of the first and second switching elements are equal to or higher than 0.85 respectively.

8. The semiconductor device according to claim 1, further comprising:

a seventh external terminal connected to a connecting point between the third switching element and the first diode and provided on the first module; and an eighth external terminal connected to a connecting point between the fourth switching element and the second diode and provided on the second module, wherein the seventh external terminal is connected to the eighth external terminal outside the first and second modules so that the third switching element is connected in inverse series connection with the fourth switching element.

* * * * *